(12) United States Patent
Cavuoti et al.

(10) Patent No.: US 9,315,412 B2
(45) Date of Patent: Apr. 19, 2016

(54) SURFACE FLAW MODIFICATION FOR STRENGTHENING OF GLASS ARTICLES

(75) Inventors: Jeanne Spadinger Cavuoti, Corning, NY (US); Donald A. Clark, Corning, NY (US); Sean Matthew Garner, Elmira, NY (US); Gregory Scott Glaesemann, Corning, NY (US); Jun Hou, Painted Post, NY (US); Jum Sik Kim, Horseheads, NY (US); Toshihiko Ono, Shizuoka (JP); Daniel Arthur Sternquist, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 475 days.

(21) Appl. No.: 13/541,206

(22) Filed: Jul. 3, 2012

(65) Prior Publication Data

US 2013/0109116 A1 May 2, 2013

Related U.S. Application Data

(60) Provisional application No. 61/505,288, filed on Jul. 7, 2011, provisional application No. 61/608,982, filed on Mar. 9, 2012.

(51) Int. Cl.
| | | |
|---|---|---|
| *H01L 21/00* | (2006.01) | |
| *C03C 15/02* | (2006.01) | |
| *H01L 33/58* | (2010.01) | |
| *G02F 1/1333* | (2006.01) | |

(52) U.S. Cl.
CPC .............. *C03C 15/02* (2013.01); *G02F 1/1333* (2013.01); *H01L 33/58* (2013.01); *Y10T 428/1095* (2015.01)

(58) Field of Classification Search
CPC ................................ C03C 15/00; C03C 15/02
USPC ........... 438/4, 27; 216/23, 103, 104; 428/1.62
See application file for complete search history.

(56) References Cited

U.S. PATENT DOCUMENTS

| | | | |
|---|---|---|---|
| 5,022,735 A | 6/1991 | Dahlgren | 350/96.21 |
| 5,157,751 A | 10/1992 | Maas et al. | 385/99 |
| 6,108,063 A | 8/2000 | Yuuki et al. | 349/95 |
| 6,197,209 B1 * | 3/2001 | Shin et al. | 216/84 |
| 6,673,195 B2 * | 1/2004 | Chen et al. | 156/345.23 |

(Continued)

FOREIGN PATENT DOCUMENTS

| | | | |
|---|---|---|---|
| JP | 2009-073711 | 4/2009 | C03C 15/00 |
| JP | 2011166923 A | 8/2011 | |

(Continued)

OTHER PUBLICATIONS

Kitaigorodskii et al. "Strengthening sheet glass by etching," Glass and Ceramics, 20, 1963, pp. 183-187.*

(Continued)

*Primary Examiner* — Mary Wilczewski
*Assistant Examiner* — Erik T Peterson
(74) *Attorney, Agent, or Firm* — Kevin M. Able

(57) ABSTRACT

Disclosed are controlled chemical etching processes used to modify the geometry of surface flaws in thin glass substrates and glass substrate assemblies formed therefrom, and in particular glass substrates suitable for the manufacture of active matrix displays that are essentially free of alkali metal oxides such as $Na_2O$, $K_2O$ and $Li_2O$.

22 Claims, 10 Drawing Sheets

(56) References Cited

U.S. PATENT DOCUMENTS

| | | |
|---|---|---|
| 7,336,334 B2 | 2/2008 | Jung et al. .................. 349/154 |
| 7,524,784 B2 * | 4/2009 | Chacon et al. ............... 501/66 |
| 2002/0067459 A1 * | 6/2002 | Sugano ...................... 349/187 |
| 2003/0057183 A1 * | 3/2003 | Cho et al. .................... 216/23 |
| 2005/0001201 A1 | 1/2005 | Bocko et al. |
| 2005/0274950 A1 * | 12/2005 | Hioki et al. .................. 257/59 |
| 2007/0215835 A1 * | 9/2007 | Kikuyama et al. .......... 252/79.3 |
| 2008/0023438 A1 * | 1/2008 | Nishino et al. .............. 216/23 |
| 2009/0075486 A1 * | 3/2009 | Kikuyama et al. .......... 438/756 |
| 2010/0247044 A1 | 9/2010 | Noddings et al. ............ 385/99 |
| 2011/0003619 A1 * | 1/2011 | Fujii ........................... 455/566 |
| 2011/0165393 A1 * | 7/2011 | Bayne et al. ................ 428/215 |
| 2012/0052302 A1 * | 3/2012 | Matusick et al. ............ 428/410 |
| 2012/0196071 A1 * | 8/2012 | Cornejo et al. .............. 428/43 |

FOREIGN PATENT DOCUMENTS

| | | | |
|---|---|---|---|
| KR | 10-0868228 | 11/2008 | ............ C09K 13/08 |
| KR | 10-0979691 | 2/2010 | ............ C03C 15/00 |
| WO | 2009157378 A1 | 12/2009 | |
| WO | 2011006031 A2 | 1/2011 | |

OTHER PUBLICATIONS

Krasovskaya et al. "The influence of the composition of the hydrofluoric acid bath on the strengthening of silicate galsses," Glass and Ceramics, 20, 1963, pp. 193-194.*

Okhrimenko et al. "Influence of strengthening by deep etching in hydrofluoric acid on the strength in axial tension of technical glass," Strength of Materials, 14, 1982, pp. 254-258.*

Kurkjian et al. "Effects of heat treatment and HF etching on the strength of silica lightguides," Proc. SPIE 5465, 2004, pp. 223-229.*

Taiwan Intellectual Property Office; Notice of First Office Action and Search Report for TW Application No. 101124227; Date of Search: Nov. 23, 2015; pp. 1-3.

* cited by examiner

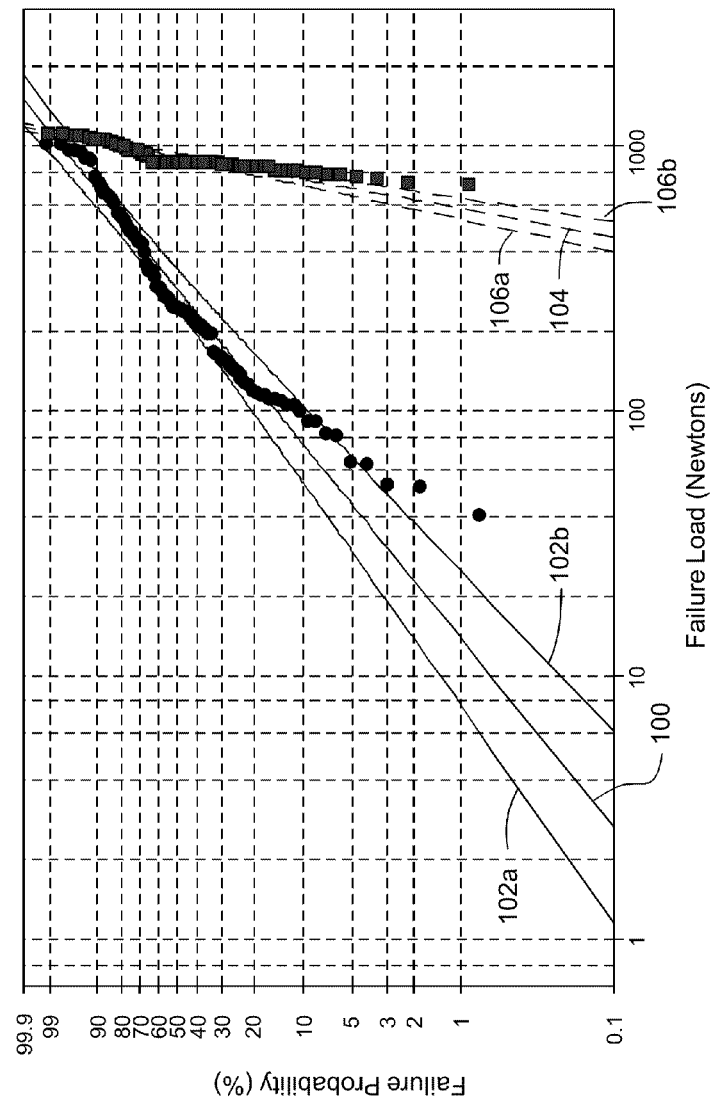

SURFACE FLAW MODIFICATION FOR STRENGTHENING OF GLASS ARTICLES

CROSS-REFERENCE TO RELATED APPLICATIONS

This application claims the benefit of priority under 35 U.S.C. §119 of U.S. Provisional Application Ser. No. 61/505,288 on Jul. 7, 2011, entitled "Surface Flaw Modification for Strengthening of Glass Articles" and U.S. Provisional Application Ser. No. 61/608,982, filed on Mar. 9, 2012, entitled "Surface Flaw Modification For Strengthening of Glass Articles", the entire contents of which are hereby incorporated by reference.

BACKGROUND

The present invention is in the field of information display technology and relates more particularly to glass substrates and glass substrate assemblies suitable for use as a transparent substrate material for active matrix information displays, photovoltaics, touch sensors, lighting and other flexible electronics, and to methods for making such articles.

Thin glass substrates are used to make display panels and touch sensors for mobile electronic devices such as cell phones, laptops, and pad computers. They are also used in TVs, video monitors, and other stationary display devices as well as photovoltaic devices (e.g. solar cells) and lighting devices. Over the past few decades the display glass panel (LCD, etc) has been well protected from mechanical stress by strengthened glass cover sheets, robust housings and/or other panel-protective device designs. For that reason the glass substrates could be cut to size by rough scribing techniques and surfaces could be exposed to contact-induced damage during panel manufacture with little consequence. However, recent developments in the design of mobile electronic devices have required the development and deployment of extremely thin glass panels as well as thinner and lighter housings for the displays. The resulting housings and panels are less rigid and higher stress levels have been observed on the glass substrate. Stresses as high as 200 MPa have been observed under some conditions of use in lightweight display devices such as e-books. Hence, the risk of glass panel breakage in advanced information display devices is increasing.

Active matrix displays such as TFT-LCD displays typically require the use of glasses of the alkaline earth boro-aluminosilicate type. These are generally glasses that are essentially free of the alkali metal oxides $Na_2O$, $K_2O$ and $Li_2O$, since active matrix displays require glass substrate surfaces that are compatible with the deposition and activation of thin-film transistor or and/or other electronic semiconductor devices. Glasses free of alkali metal oxides, however, are not chemically strengthenable by the ion-exchange methods used to strengthen display components such as protective glass cover sheets for information displays. Accordingly, the problem of glass panel breakage cannot be addressed through conventional chemical tempering methods.

Economical processes for producing display glass of high optical and surface quality include drawing processes such as fusion drawing (overflow down-drawing) and slot drawing. These methods produce glass substrates with surfaces that are pristine and essentially free of surface flaws as drawn. Unfortunately, using presently available substrate handling methods, surface flaws are invariably introduced as the drawn glass substrates are cut and packaged for delivery to panel fabricators. Depending on the number, size and shape of these flaws, significant weakening of the sheets can occur. Such weakening leads to the probability of mechanical failure from these flaws on the glass substrates being delivered to the fabricators for processing.

The problem of surface flaws is aggravated when the glass substrates to be employed are required to be thin so as to be flexible. Flexible glass substrates are of increasing interest for lightweight electronic or other devices where the performance of plastic or metal substrates does not meet device manufacturing or device performance requirements. With the increasing interest in flexible display electronics for such devices, there is a correspondingly increased need for high quality flexible substrates that are compatible with new product designs and manufacturing processes. Flexible glass substrates are being more widely integrated into such processes and designs due to their advantages of hermeticity, optical transparency, surface smoothness, and thermal and dimensional stability.

Commercially desirable forms of flexible glass substrates include spooled or so-called "roll-to-roll" glass ribbons. To be practical as a flexible electronics substrate material, however, spooled flexible glass ribbon must improve to meet the chemical and mechanical durability requirements of both customer processing and end-use applications. Again, maintaining the required level of glass mechanical reliability requires minimizing defects as well as controlling stresses during the manufacture and rolling or spooling of the glass ribbon.

The need for strengthening glass extends beyond removing flaws from singular glass substrates or lengths of glass ribbon. Even in the case where such flaws can be removed, assembly practices for manufacturing display devices, for example the substrate assemblies used to build display panels, may simply re-introduce flaws into the glass. Thus, regardless the high-strength pristine nature of the originating substrates or ribbon used in forming the device, the manufacturing process degrades the glass strength.

SUMMARY

In accordance with the present disclosure, controlled treatment of glass surfaces with an aqueous acid solution are used to modify the geometry of surface flaws. The flaws are not removed but rather treated to modify their crack propagation characteristics. The success of the method is based on the recognition that handling-induced surface damage is overwhelmingly sharp contact damage that results in flaws with sharp crack tips having a high propensity to propagate. Through the use of the presently disclosed methods, the geometry of such flaws can be modified by an aqueous acid solution to substantially reduce the tendency of sharp surface flaws to propagate, while not greatly reducing the sizes of the flaws or materially changing the chemical and optical characteristics of the glass surface. The result is a significant increase in glass strength without significant material removal or change in glass thickness.

The advantages of the disclosed methods are several. The increases in glass substrate strength are general, affecting the treated surfaces and may include edges and through-holes or other features of the substrate. Thus, the strengthening process is essentially independent of the shape of the treated glass, and in some embodiments glass substrate assemblies comprising a plurality of glass substrates may be treated. Further, since glass substrate thickness changes are minimal (not more than a few microns), even ultra-thin or flexible glass substrates can be successfully strengthened. And, minimal material removal helps to lower processing costs per part, both by minimizing the usage of the aqueous acid solution and the need for refreshment of the aqueous acid solution, and by enabling strengthening in a relatively short period of time (order of minutes, or even seconds).

Due to the gentle nature of the treatments, less aggressive aqueous acid solutions can be used, a factor that helps to preserve the functionality of any pre-applied components of sensitive electronic devices. Thus, more device types can be treated after device fabrication than is typically allowed. Further, the dimensional precision of the substrates and/or devices (e.g. assemblies) can be maintained because these mild aqueous acid solution treatments do not alter overall substrate dimensions after precision cutting or shaping; the length, width, thickness, and through-hole or other feature dimensions are not significantly altered.

Accordingly, method of the present disclosure can be applied to substrate assemblies comprising two or more joined glass substrates. Such substrate assemblies may include, for example, assemblies used in the manufacture of displays, such as liquid crystal displays.

The methods of the present disclosure can also be adapted for use in the strengthening of flexible glass substrates to be employed in roll-to-roll display device fabrication. The aqueous acid solution treatment steps required are of sufficiently short duration, and the aqueous acid solution sufficiently mild, that the continuous processing of long lengths of flexible glass becomes both practical and economically advantageous. A wide variety of roll-to-roll processing options can be implemented. Examples include the continuous through-cutting of long glass ribbon lengths in the long direction to continuously convert a wide glass web (i.e. ribbon) to two narrower ribbons, as well as continuous masking approaches that enable the selective etch-induced strengthening of cut glass substrate edges.

Accordingly, in one aspect a method for manufacturing an electronic device is disclosed comprising: depositing thin film transistors on a first glass substrate; joining the first glass substrate to a second glass substrates to form a glass substrate assembly, there being a gap between the first and second glass substrates; contacting the glass substrate assembly with an aqueous acidic solution for a time not exceeding 10 minutes; injecting a liquid crystal material into the gap; and wherein the contacting is performed after the step of joining but before the step of injecting. The contacting may be conducted, for example, for a time not exceeding 5 minutes. In some embodiments, the contacting does not exceed about 4 minutes, whereas in other embodiments the step of contacting does not exceed about 3 minutes.

In some embodiments the contacting may be performed for a period as short as 10 seconds. Therefore, suitable contacting times in accordance with embodiments of the present disclosure fall within a range from about 10 seconds to about 10 minutes, in some examples in a range from about 10 seconds to about 5 minutes, in some examples in some examples in a range from about 10 seconds to about 4 minutes and in some examples in a range from about 10 seconds to about 3 minutes. The contacting may remove glass from each of the first and second substrates to a depth equal to or less than about 20 µm, for example, the contacting may remove glass from each of the first and second substrates to a depth equal to or less than about 15 µm and in other examples the contacting may remove glass from each of the first and second substrates to a depth equal to or less than about 10 µm and in still other examples the contacting may remove glass from each of the first and second substrates to a depth equal to or less than about 5 µm. At least one of the first or second glass substrates comprises may be an alkaline earth boro-aluminosilicate glass. For example, at least one of the first or second glass substrates may comprise an alkaline earth boro-aluminosilicate glass wherein a total concentration of alkali metal oxides selected from the group consisting of $Na_2O$, $K_2O$ and $Li_2O$ in the first or second glass substrate does not exceed 5% by weight.

In some examples, the substrate assembly is thinned prior to the contacting by exposing the substrate assembly to an etchant that removes glass from each of the first and second glass substrates to a depth of at least about 100 µm and then washing the substrate assembly. The glass may be washed, for example, by using a brush.

In some embodiments the method may further comprise applying a polymer film to the glass article after the step of contacting. The polymer film may be removed, such as prior to the application of a polarizing material to the glass substrate assembly.

In some embodiments the glass substrate assembly may be a large master glass substrate assembly, wherein the method further comprises separating the master glass substrate assembly into a plurality of individual glass substrate assemblies, and wherein the step of contacting occurs after the step of separating.

The method according the present aspect may comprise an aqueous acidic solution of HF and HCl such that a molar concentration of the HF is in a range from about 0.1M to about 6M and a molar concentration of the HCl is in a range from about 0.1M to about 7.0M. In other examples the aqueous acidic solution comprises HF and HCl, wherein a molar concentration of the HF is in a range from about 0.1M to about 3.0M and a molar concentration of the HCl is in a range from about 0.1M to about 6.0M. In still other examples the aqueous acidic solution comprises HF and HCl wherein a molar concentration of the HF is in a range from about 1.5M to about 2.5M and a molar concentration of the HCl is in a range from about 4.0M to about 5.0M. In yet other examples the aqueous acidic solution comprises HF and $H_2SO_4$, wherein the molar concentration of $H_2SO_4$ is in ranges equal to the ranges for HCl above.

In some embodiments a thickness of either one or both of the first or second glass substrate does not exceed 500 µm, such as before a thinning step.

In certain embodiments one or both of the first or second glass substrates is substantially free of surface compression layers and central tensional stresses.

In some embodiments the first or second glass substrate comprises strength-limiting surface flaws and the strength-limiting surface flaws after contacting with the aqueous acid solution comprise flaws with rounded crack tips having at least one of a flaw depth and a flaw diameter in excess of 5 µm in size.

In another aspect a method for manufacturing an electronic device is described comprising: depositing a thin film transistors on a first glass substrate; joining the first glass substrate to a second glass substrate to form a master glass substrate assembly, there being a gap between the first and second glass substrates; thinning the master glass substrate assembly by exposing the master glass substrate assembly to an etching solution that removes glass from each of the first and second substrates to a depth of at least about 100 µm; washing the substrate assembly, wherein the washing comprising contacting the master glass substrate with a brush; contacting the substrate assembly for a time not exceeding 5 minutes with a second aqueous acidic etching solution after the washing. The method may further comprise applying a polymer film to the master glass substrate after the step of contacting. In some examples the method may further comprise separating the master glass substrate assembly into a plurality of individual glass substrate assemblies prior to the contacting. The polymer film may be removed from at least one of the individual glass substrate assemblies. For example, the polymer film may be removed prior to applying a polarizing film to at least one of the individual glass substrate assemblies.

In some embodiments a thickness of at least one of the first or second glass substrates does not exceed 500 µm before the thinning with the etching solution. In some examples at least one of the first or second glass substrates is substantially free of surface compression layers and central tensional stresses.

In another aspect, the present disclosure provides information display substrates wherein flaw-induced substrate breaking stresses are a function of flaw shape factors rather than being dictated solely by the fracture mechanics of a sharp surface flaw. Particularly included is an electronic-device-compatible information display substrate incorporating strength-limiting surface flaws, wherein tensile stresses $\sigma_A$ arising at crack tips emanating from the surface flaws as the result of a global stress $\sigma$ applied to the substrate depend predominantly upon the flaw depth, a, and crack tip radii, $\rho$, in accordance with the equation:

$$\sigma_A = \sigma\left(1 + \sqrt{\frac{a}{\rho}}\right)$$

Display substrates with the disclosed stress response characteristics include those wherein the strength-limiting surface flaws include flaws with rounded crack tips having at least one of a flaw depth and a flaw diameter in excess of 5 µm in size.

In another aspect, the present disclosure provides methods for making strengthened glass substrate having stress response characteristics such as above described. Included is a method for increasing the fracture resistance of a glass substrate comprising surface flaws, including surface flaws having at least one of a flaw diameter and a flaw depth exceeding 5 µm in size, comprising contacting at least one surface of the glass substrate with an aqueous acid solution for a time and at a temperature effective to round or blunt the tip portions of cracks emanating from the surface flaws. In these and other aspects, substrate surfaces include both the 2 major surfaces as well as the surfaces of the edge faces.

In yet another aspect, the present disclosure provides a method for increasing the fracture resistance of a video display panel component comprising an array of electronic device components disposed on a glass substrate, the glass substrate comprising surface flaws and said surface flaws including flaws having at least one of a flaw diameter and a flaw depth in excess of 5 µm in size, comprising contacting at least one surface of the panel with a chemical etching medium for a time and at a temperature effective to round or blunt the tip portions of cracks emanating from the surface flaws.

The above disclosed methods enable the manufacture of display panel substrates that are compatible with semiconductor electronic device components as well as sufficiently flexible for use in roll-to-roll display substrate manufacturing procedures. One such substrate is a flexible electronic-device-compatible information display substrate comprising a flexible glass substrate incorporating strength-limiting surface flaws, wherein tensile stresses $\sigma_A$ arising at crack tips emanating from the surface flaws as the result of a global stress $\sigma$ applied to the substrate depend predominantly upon the flaw depth, a, and crack tip radii, $\rho$, in accordance with the equation:

$$\sigma_A = \sigma\left(1 + \sqrt{\frac{a}{\rho}}\right)$$

For the purposes of the present description a flexible glass substrate, such as a sheet or and elongated glass ribbon or display panel substrate is one that can be bent to a radius of curvature as small as 10 cm without breakage, following treatment in accordance with the present disclosure. A flexible substrate exhibiting the above-disclosed stress response characteristics and flexibility can be stored and processed as a spooled glass ribbon, i.e., as a length of glass substrate coiled on any spool incorporating a spindle having a diameter larger than the radius of curvature at which stress breakage of the substrate will occur.

Spooled flexible glass ribbons or individual display panel substrates or substrate assemblies provided in accordance with the present disclosure incorporate strength-limiting surface flaws, including flaws with blunted or rounded crack tips having at least one of a flaw diameter and a flaw depth exceeding 5 µm in size. Further, at least a portion of the length of the spooled glass ribbon or substrate is coiled on the spindle of a selected spool at a bend radius larger than the radius at which breakage of the flexible glass ribbon can occur.

In yet another aspect, the present disclosure provides methods for manufacturing flexible electronic-device-compatible information display substrates such as above disclosed. Particular embodiments include a method for manufacturing a flexible electronic-device-compatible information display substrate comprising an elongated flexible glass ribbon, said flexible glass ribbon comprising surface flaws that include flaws having at least one of a flaw diameter and a flaw depth exceeding 5 µm in size, comprising the step of sequentially contacting the elongated glass ribbon along its length with an aqueous acid solution. Methods wherein the glass ribbon is continuously transported into contact with and then separated from contact with the aqueous acid solution are of particular commercial importance.

In still another aspect, a plurality of glass substrate assemblies is described wherein each glass substrate assembly of the plurality of substrate assemblies comprises: a first glass substrate having a plurality of thin film transistors deposited thereon; a second glass substrate sealed to the first glass substrate with an adhesive to form the glass substrate assembly, there being a gap between the first and second glass substrates; and wherein the plurality of glass substrate assemblies comprises equal to or greater than 30 glass substrate assemblies selected at random from a population of like substrate assemblies, and wherein when each of the plurality of glass substrate assemblies is positioned on a rigid ring having a diameter of 42.5 mm and subjected to a point force centered within a circumference of the rigid ring and stressed to failure and the failure stresses for the plurality of glass substrate assemblies is plotted as a Weibull distribution, the Weibull parameter $\sigma_0$ for the plurality of substrate assemblies at a probability of 63% is greater than about 800 N and the Weibull parameter m for the plurality of substrate assemblies is greater than about 8.0.

In another aspect a glass substrate assembly is selected from at least 30 glass substrate assemblies that are identical except for manufacturing tolerances, wherein each of the glass substrate assemblies comprises: a first glass substrate having a plurality of thin film transistors deposited thereon; a second glass substrate sealed to the first glass substrate with an adhesive to form the glass substrate assembly, there being a gap between the first and second glass substrates; and wherein when each of the at least 30 glass substrate assemblies is positioned on a rigid ring having a diameter of 42.5 mm and subjected to a point force centered within a circumference of the rigid ring and stressed to failure, and the failure stresses for the at least 30 glass substrate assemblies is plotted as a Weibull distribution, the Weibull parameter $\sigma_0$ for the at least 30 glass substrate assemblies at a probability of 63% is greater than about 800 N and the Weibull parameter m for the plurality of substrate assemblies is greater than about 8.0. The at least 30 glass substrate assemblies may be randomly selected from a population of like glass substrate assemblies.

DESCRIPTION OF THE DRAWINGS

The glass products and methods of the present disclosure are further described below with reference to the appended drawings, wherein:

FIG. 10 presents surface-based failure probability data for treated and untreated glass substrate assemblies;

DETAILED DESCRIPTION

It is known that the handling of display glass substrate during the manufacture of display panels can result in sharp contact damage to the surfaces of the panel. This is due to the particular way in which glass responds to mechanical contact. The flaws resulting from sharp contact damage can be produced by any of the various types of equipment used to manipulate large glass panels as they are cut from continuously drawn ribbons of glass produced by the melting and forming equipment conventionally used for continuously drawn glass substrate manufacture. The edges as well as the surfaces of the individual glass panels can exhibit defects caused in this way. However, recent experiments have shown that the processing steps involved in the manufacture of glass panel assemblies also plays a role in the reliability of assemblies formed from the panel.

Figure 1:
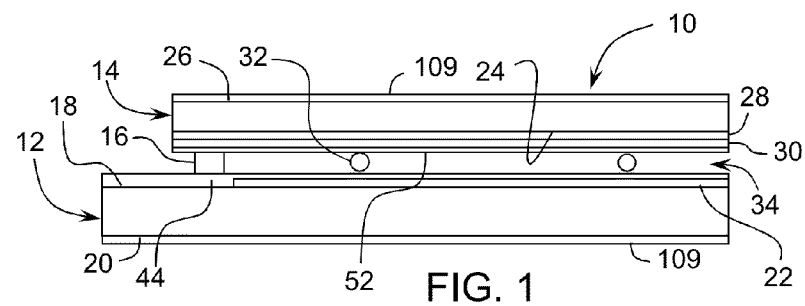
FIG. 1 is a cross sectional edge view of an exemplary glass substrate assembly.

FIG. 1 illustrates an edge portion of a glass substrate assembly 10 for use in the manufacture of an LCD display panel such as an active matrix liquid crystal display panel. Substrate assembly 10 comprises a first glass substrate 12, a second glass substrate 14, wherein the first and second glass substrates are sealed together by a sealing material 16 positioned between the first and second glass substrates. Sealing material 16 may be, for example, a UV-curable epoxy. However, in other embodiments, sealing material 16 may be, for example, a glass frit. First glass substrate 12 comprises first major surface 18 and second major surface 20. First glass substrate 12 may include thin film transistors and various transparent electrical busses necessary for addressing individual pixels of the display panel disposed on a first surface thereof, represented by layer 22. Second glass substrate 14 comprises first major surface 24 and second major surface 26. Second glass substrate 14 may further include color filter materials 28 disposed on first major surface 20, and may also include a transparent conductor layer 30, such as a layer of indium tin oxide (ITO), which can function as a common electrode for the display panel formed from the substrate assembly and which transparent conductor layer 30 is formed over color filter layer 28. Substrate assembly 10 may further include spacers 32 disposed between the first and second glass substrates, wherein spacers 32 serve to maintain a consistent width of gap 34 between the first and second glass substrates.

Figure 2:
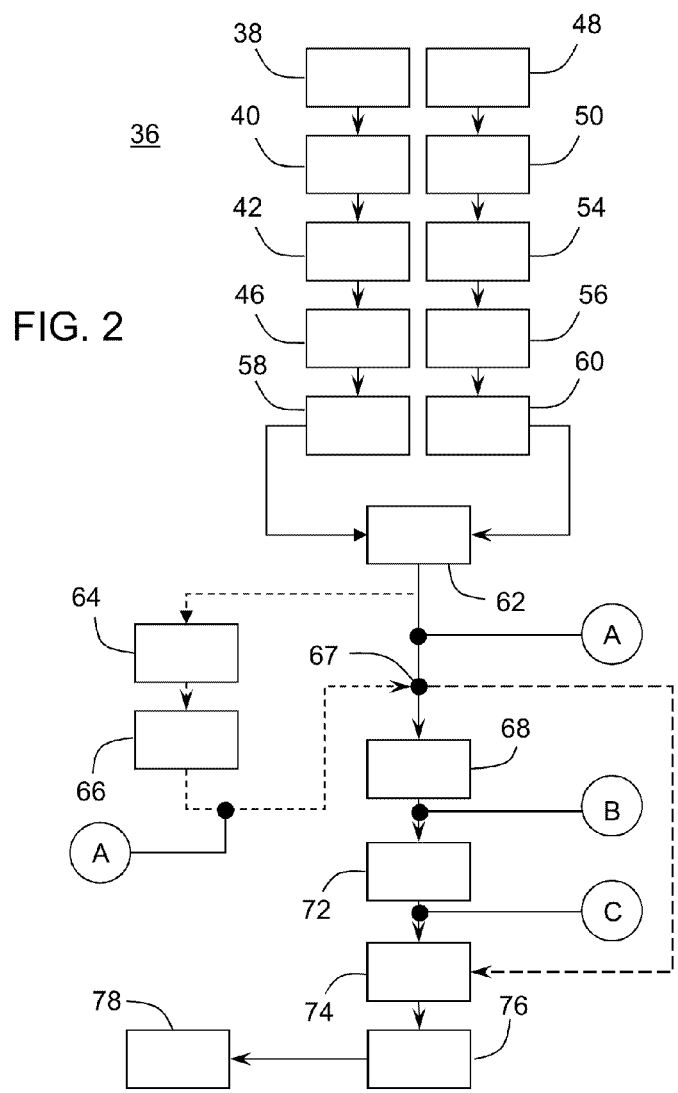
FIG. 2 is flow diagram of an exemplary glass substrate assembly manufacturing process.

FIG. 2 depicts an exemplary process 36 for manufacturing a glass LCD display panel. Actual manufacturing methods may differ based on specific manufactures. In accordance with the exemplary process of FIG. 2, first glass substrate 12 is provided at step 38. At step 40 the first glass substrate is washed, dried, and an array of thin film transistors (TFTs), represented by layer 22 in FIG. 1, and their accompanying data and select lines are deposited on first surface 18 of first substrate 12 by chemical vapor deposition (e.g. plasma enhanced chemical vapor deposition, PECVD) and/or sputtering (e.g. RF sputtering), and etching using photolithography techniques. The process complexity will depend on whether the process is an amorphous silicon process or a poly-crystalline silicon process.

At step 42, a polymer coating 44 may be applied to first glass substrate 12 over the TFTs, for example a polyamide coating. The polymer coating is cured, and then the surface of the cured polymer surface is rubbed or polished at step 46 to create a preferential alignment direction for liquid crystal molecules that will occupy gap 34. Alternatively, a diamond-like carbon layer may be applied over first surface 18 and ion beam-treated to create the preferential alignment of liquid crystal molecules.

In a separate process, beginning at step 48, second glass substrate 14 is provided. At step 50, color filter material layer 28 may be deposited on the second glass substrate. For example, in the production of a red-green-blue (RGB) color filter, a black matrix material (e.g. $Cr/CrO_2$ or a black polymer material) is deposited on the second glass substrate in a pattern that blocks light in the inter-pixel areas, shields the TFT array from ambient light, and improves contrast ratio. Then, a first color filter material, such as a dyed or pigmented UV curable material, e.g. red, may be applied to the glass substrate, exposed to UV light through a mask, and developed, wherein the uncured regions of the resin are removed. Next, the second color, e.g. green, is applied, cured and developed. The process is repeated for the last color, e.g. blue. Once the RGB colors have been deposited, a polymer layer 52, such as a polyamide layer, may be applied at step 54. The polymer layer 52 is cured, and then the surface of cured polymer layer 52 is rubbed or polished at step 56 to create a preferential alignment direction for liquid crystal molecules that will occupy gap 34. Alternatively, a diamond-like carbon layer may be applied over first surface 24 of second glass substrate 14 and ion beam-treated to create the preferential alignment of liquid crystal molecules. Step 56 may further comprise the application of a transparent conductive film 30, such as indium tin oxide (ITO), which forms a common transparent electrode.

Next, spacers 32 may be sprayed (e.g. plastic spheres having a diameter of about 4-5 μm) onto first glass substrate 12 at step 58. Spacers 32 aid in maintaining a consistent gap 34 between the two glass substrates 12, 14 when the two glass substrates are sealed together. Although FIG. 1 depicts spherical spacers, such randomly dispersed spheres may end up over pixel areas and can impact contrast ratio. Consequently, in some processes randomly sprayed spacers are replaced with photolithography-patterned column spacers.

At step 60, sealing material 16, such as a UV-curable epoxy, is applied over first major surface 24 of second glass substrate 14.

At step 62, first glass substrate 12 and second glass substrate 14 are aligned and brought together, wherein the sealing material forms a loop around the TFT array. The sealing material is then cured to form glass substrate assembly 10.

Figure 3:
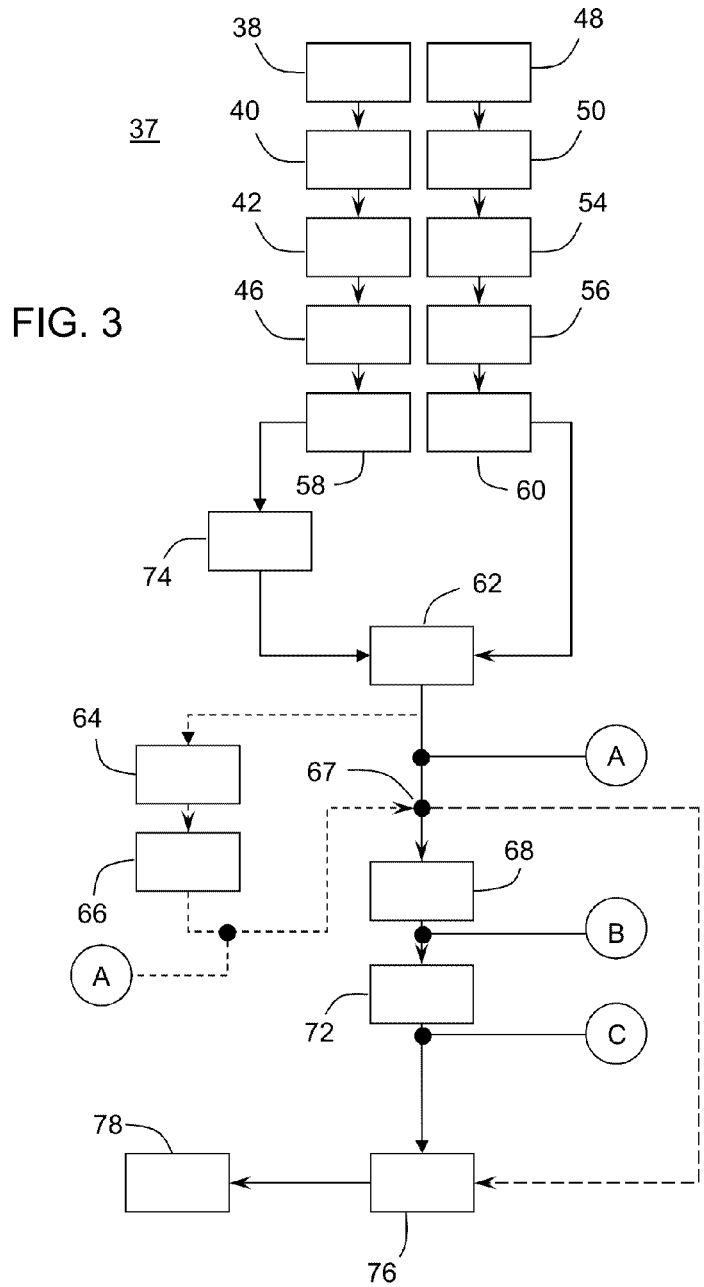
FIG. 3 is flow diagram of another exemplary glass substrate assembly manufacturing process.

It should be recognized that the above process overview is a simple representation of a complex process, and is not meant to be limiting in any way. For example, while the preceding description of a liquid crystal display manufacturing process is provided in respect of a single substrate assembly for use in a single display panel, such displays panels are often produced many at a time. That is, as shown in FIG. 3, large glass substrates (i.e. first and second glass substrates 12 and 14, respectively) may be used to form a single master substrate assembly 10a, wherein multiple TFT arrays and multiple color filter arrays are sealed between the large glass substrates as separate and distinct display elements.

For small display devices, such as mobile phones, notebook computers and laptop computers, and other similar devices, there is a commercial desire to drive the devices to be as thin as possible. Thus, display-type glasses common in large devices, such as televisions (TVs), takes up a considerable thickness of the device. For example, a typical sheet (e.g. substrate) of glass used in a television has a thickness of about 0.7 mm. The typical thickness of a glass substrate used in a mobile phone has a thickness of about 0.3 mm. However, while 0.3 mm glass substrates are technically achievable and may be commercially available, they are nevertheless difficult to process in a manufacturing environment without damage, and so other steps may be undertaken to thin the substrate assembly once the two substrates are sealed together. To wit, in an optional process, the sealed substrate assembly comprising the first (TFT) glass substrate 12 and the second (color filter) glass substrate 14 are sealed around their edges by a sealing material (not shown), after which the substrate assembly may be exposed to an etching solution that removes material from both exposed second major surfaces 20 and 26 of the substrate assembly in optional thinning step 64 in FIG. 2. The edge seal prevents ingress of the etching solution. In some processes a thickness of the starting glass substrates may originally be about 0.5 mm, but then have approximately 100 μm or even as much as 200 μm or more of glass removed from the surfaces of each substrate by the etching solution used for thinning.

One particular drawback of the optional thinning process is the formation of sludge formed by the dissolved glass. Accordingly, the surfaces of the substrate assembly should be thoroughly washed. This may be accomplished at optional step 66 by contacting the surfaces of the substrate assembly with a cleaning liquid and brushing the surfaces of the substrate assembly with a brush, such as a rotating brush.

At node 67, if the substrate assembly was a master substrate assembly 10a, the process can proceed to step 68 where the master panel assembly is separated into separate substrate assemblies 10, such as by scribing the master panel assembly with a diamond scribe along scribe lines 70 and breaking. As shown in FIG. 2, a washing/rinsing step 72 may follow the separating step to remove any particulate formed from the separating process that may have adhered to the second major surfaces of the substrate assembly.

If the substrate assembly from step 62 was a single substrate assembly 10 and does not require separation, the process can proceed to step 76 from node 67. It should be understood that other process steps may be involved between node 67 and step 76. For example, a layer of ITO may be deposited on substrate 14, for example as a layer comprising a touch-sensitive circuit. Alternatively, an antireflection layer, or other layer, may be added. In any event, process 36 may be modified appropriately.

Whether formed from a large master glass substrate assembly comprising a plurality of TFT arrays and separated into smaller individual glass substrate assemblies, or a single glass substrate assembly comprising a single TFT array is formed, once the individual glass substrate assembly is formed comprising the TFT substrate, the color filter substrate and the sealing material, gap 34 is then filled with a liquid crystal material at step 74 by vacuum injection, such as through a passage left open in the adhesive seal. Thereafter the passage is sealed, and at step 76 a polarizing film may be applied to one or typically both surfaces of the panel assembly. Once the individual glass substrate assembly 10 is formed, the individual glass substrate assembly moves to downstream display panel processes, represented by step 78 in FIG. 2

FIG. 3 depicts another exemplary process 37 for manufacturing a glass LCD display panel. Again, actual manufacturing methods may differ based on specific manufactures. In accordance with the exemplary process of FIG. 3, first glass substrate 12 is provided at step 38. At step 40 the first glass substrate is washed, dried, and an array of TFTs, represented by layer 22 in FIG. 1, and their accompanying data and select lines are deposited on first surface 18 of first substrate 12 by chemical vapor deposition (e.g. plasma enhanced chemical vapor deposition, PECVD) and/or sputtering (e.g. RF sputtering), and etching using photolithography techniques. The process complexity will depend on whether the process is an amorphous silicon process or a poly-crystalline silicon process.

At step 42, a polymer coating 44 may be applied to first glass substrate 12 over the TFTs, for example a polyamide coating. The polymer coating is cured, and then the surface of the cured polymer surface is rubbed or polished at step 46 to create a preferential alignment direction for liquid crystal molecules that will occupy gap 34. Alternatively, a diamond-like carbon layer may be applied over first surface 18 and ion beam-treated to create the preferential alignment of liquid crystal molecules.

In a separate process, beginning at step 48, second glass substrate 14 is provided. At step 50, color filter material layer 28 may be deposited on the second glass substrate. For example, in the production of a red-green-blue (RGB) color filter, a black matrix material (e.g. $Cr/CrO_2$ or a black polymer material) is deposited on the second glass substrate in a pattern that blocks light in the inter-pixel areas, shields the TFT array from ambient light, and improves contrast ratio. Then, a first color filter material, such as a dyed or pigmented UV curable material, e.g. red, may be applied to the glass substrate, exposed to UV light through a mask, and developed, wherein the uncured regions of the resin are removed. Next, the second color, e.g. green, is applied, cured and developed. The process is repeated for the last color, e.g. blue. Once the RGB colors have been deposited, a polymer layer 52, such as a polyamide layer, may be applied at step 54. The polymer layer 52 is cured, and then the surface of cured polymer layer 52 is rubbed or polished at step 56 to create a preferential alignment direction for liquid crystal molecules that will occupy gap 34. Alternatively, a diamond-like carbon layer may be applied over first surface 24 of second glass substrate 14 and ion beam-treated to create the preferential alignment of liquid crystal molecules. Step 56 may further comprise the application of a transparent conductive film 30, such as indium tin oxide (ITO), which forms a common transparent electrode.

Next, spacers 32 may be sprayed (e.g. plastic spheres having a diameter of about 4-5 µm) onto first glass substrate 12 at step 58. Spacers 32 aid in maintaining a consistent gap 34 between the two glass substrates 12, 14 when the two glass substrates are sealed together. Although FIG. 1 depicts spherical spacers, such randomly dispersed spheres may end up over pixel areas and can impact contrast ratio. Consequently, in some processes randomly sprayed spacers are replaced with photolithography-patterned column spacers.

At step 60, sealing material 16, such as a UV-curable epoxy, is applied over first major surface 24 of second glass substrate 14, at which point the process of FIG. 3 deviates from the process of FIG. 2. In the process of FIG. 2, the glass substrates were brought together, after which the liquid crystal material could be vacuum-injected into individual cells.

In accordance with the process of FIG. 3, after step 58, liquid crystal material is deposited on the pixel area(s) of the display. Thus, not until after the depositing of the liquid crystal material are the first and second substrates brought together wherein the sealing material forms a loop around the TFT array and is completely sealed and cured at step 62 to form glass substrate assembly 10

Figure 4:
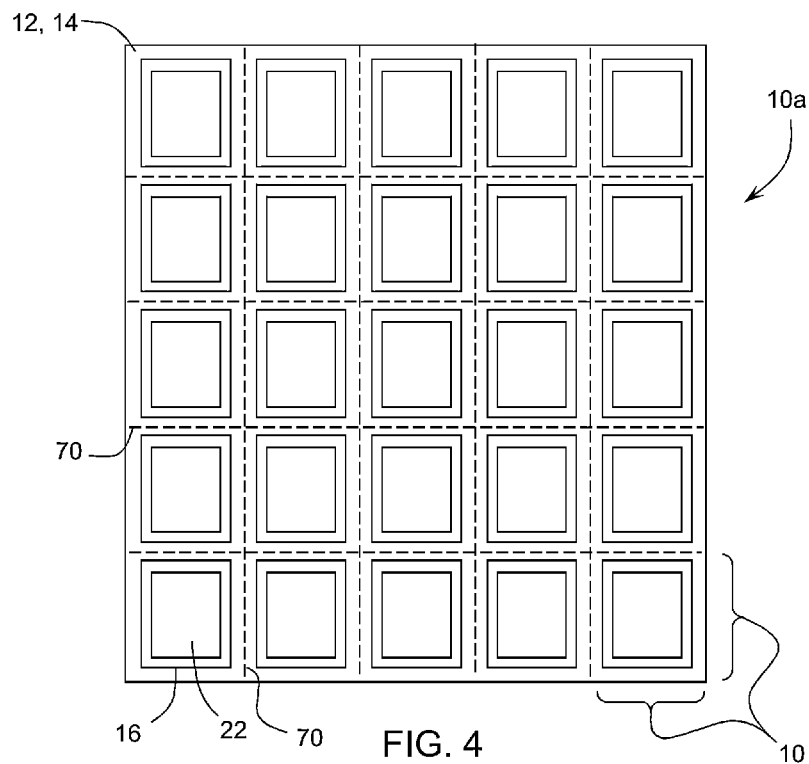
FIG. 4 is a top view of a master glass substrate assembly from which smaller glass substrate assemblies may be separated.

As with FIG. 2, it should be recognized that the preceding overview of the process of FIG. 3 is a simple representation of a complex process, and is not meant to be limiting in any way. For example, while the preceding description of a liquid crystal display manufacturing process according to FIG. 3 is provided in respect of a single substrate assembly for use in a single display panel, such displays panels are often produced many at a time. That is, as shown in FIG. 4, large glass substrates (i.e. first and second glass substrates 12 and 14, respectively) may be used to form a single master substrate assembly 10*a*, wherein multiple TFT arrays and multiple color filter arrays are sealed between the large glass substrates as separate and distinct display elements.

In optional process steps, the sealed substrate assembly comprising the first (TFT) glass substrate 12 and the second (color filter) glass substrate 14 may be sealed around their edges by a sealing material (not shown), after which the substrate assembly may be exposed to an etching solution that removes material from both exposed second major surfaces 20 and 26 of the substrate assembly in optional thinning step 64 in FIG. 3. The edge seal prevents ingress of the etching solution. In some processes a thickness of the starting glass substrates may originally be about 0.5 mm, but then have approximately 100 µm or even as much as 200 µm or more of glass removed from the surfaces of each substrate by the etching solution used for thinning.

As described previously in the context of FIG. 2, a particular drawback of the optional thinning process is the formation of sludge formed by the dissolved glass. Accordingly, the surfaces of the substrate assembly should be thoroughly washed. This may be accomplished at optional step 66 in process 37 by contacting the surfaces of the substrate assembly with a cleaning liquid and brushing the surfaces of the substrate assembly with a brush, such as a rotating brush.

At node 67, if the substrate assembly was a master substrate assembly 10*a*, the process can proceed to step 68 where the master panel assembly is separated into separate substrate assemblies 10, such as by scribing the master panel assembly with a diamond scribe along scribe lines 70 and breaking. As shown in FIG. 2, a washing/rinsing step 72 may follow the separating step to remove any particulate formed from the separating process that may have adhered to the second major surfaces of the substrate assembly.

If the substrate assembly from step 62 was a single substrate assembly 10 and does not require separation, the process can proceed to step 76 from node 67. It should be understood that other process steps may be involved between node 67 and step 76. For example, a layer of ITO may be deposited on substrate 14, for example as a layer comprising a touch-sensitive circuit. Alternatively, an antireflection layer, or other layer, may be added. In any event, process 36 may be modified appropriately.

Upon completion of step 76, the individual glass substrate assembly 10 moves to downstream display panel processes, represented by step 78 in FIG. 3

Newly-formed pristine glass that has not been contacted is inherently very strong. However, subsequent contact generally results in the formation of flaws in the surface of the glass that reduce the strength of the glass. For example, the optional brushing operation used to clean the surfaces of the substrate assembly described above at step 66 of either process 36 or process 37 may significantly degrade the strength of the glass comprising the substrate assembly. Even without a thinning process and subsequent cleaning, processing of the first and second substrates to form the TFTs and color filters requires handling of the first and second glass substrates, respectively, which may also degrade the strength of the glass substrates. The chart in FIG. 5 illustrates the strength degradation that can occur at different points in the display manufacturing process.

Figure 5:
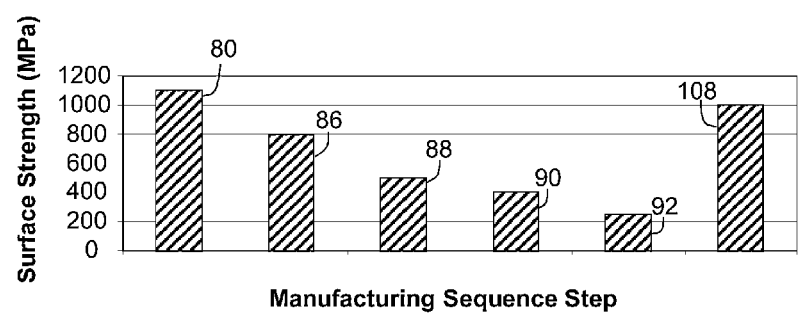
FIG. 5 is a bar graph of failure stresses for various points in the manufacturing process of FIG. 3.
Figure 6:
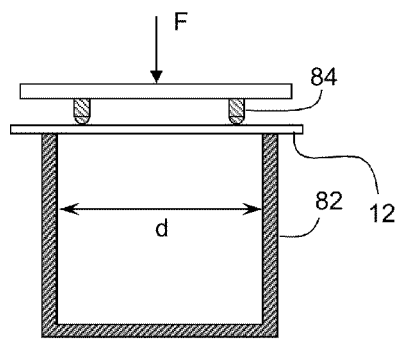
FIG. 6 is a cross sectional side illustration of an apparatus for performing ring-on-ring strength testing.

Referring now to FIG. 5, bar 80 depicts the failure stress of glass substrates used to produce a panel assembly (e.g. glass substrate 12 or 14) in MPa, as provided from the manufacturer, i.e. at steps 38, 48. The data show a failure stress of approximately 1100 MPa. Testing employed to develop FIG. 5 utilized a ring-on-ring testing technique. An apparatus for conducting ring-on-ring testing is shown in FIG. 6, showing a rigid ring (e.g. a cylindrical container 82 having an open mouth). The article to be tested is positioned over the rigid container/ring 82 and a plate having an open rigid ring 84 attached thereto is positioned over the article, indicated as glass substrate 12 in FIG. 6. A force F is then applied to the plate at a predetermined rate, thereby causing a deflection in the article produced by ring 84 until the article fails. A load cell records the force F. See also, for example, ASTM C1683-10, Standard Practice for Size Scaling of Tensile Strengths Using Weibull Statistics for Advanced Ceramics. Bar 86 represents the strength of the glass substrates prior to the deposition of TFTs or color filter material, i.e. after steps 38, 48 but before steps 40 and 50, and indicates a failure stress of about 800 MPa. Bar 88 depicts the failure stress after the deposition of TFTs and color filter material, i.e. after steps 40 and 50 but before step 62, and indicates a failure stress of approximately 400 MPa. Bar 90 shows the failure stress after assembly step 62 but before separating step 68. Finally, bar 92 shows a failure stress of approximately 250 MPa after the completion of step 72. The data show a continued decline in failure stress (e.g. glass strength) of the glass substrates, and later the glass panel assembly, as the glass substrates and panel assembly progress through the display panel manufacturing process, from a high of about 1100 MPa at the point where the individual glass substrates are provided into the process to a low of only about 250 MPa where the panel assembly has been formed, diced (separated) and rinsed to form individual panel assemblies, over a 400% decline in strength as a consequence of handling.

FIG. 5 shows that there are optimal locations at which to apply an aqueous acid solution treatment according to examples of the present disclosure. For example, the data show that glass strength continues to decline at least through the assembly step 62. Accordingly, a treatment with an aqueous acid solution as described herein is more effective if applied, for example, at point A, as shown in FIGS. 2 and 3, after assembly step 62, than prior to step 62. Alternatively, if the glass substrate assembly is a master glass substrate assembly (i.e. glass substrate assembly 10a) that undergoes separation at step 68 into individual glass substrate assemblies 10), the individual glass substrate assemblies 10 may be treated with an aqueous acid solution at point B, after the step of separating. In still another variation, the individual glass substrate assemblies 10 may be treated with an aqueous acid solution after the washing step, at point C. In short, optimal prevention of glass strength degradation can be achieved if the glass substrate assembly 10 (10a) is treated with an aqueous acid solution at a point in manufacturing process 36 after assembly step 62 and before the liquid crystal injection step 74 of process 36, or after assembly step 62 and before application of a polarizing film at step 76 of process 36.

The effectiveness of present methods for strengthening flawed glass panels can be understood in terms of fracture mechanics principles. When a sharp crack emanating from an edge or surface flaw is exposed to a global stress, e.g., a stress caused by strain applied to the entire panel, the stress at the crack tip goes to infinity, i.e., there is a stress singularity at the crack tip. One reason why such cracks don't result in immediate failure is that the glass host material has a certain resistance to crack propagation, that resistance arising from a material property called "fracture toughness".

Glass has a low fracture toughness. Furthermore, for flaws that fall within the generally applicable fracture mechanics framework, the strength of a flawed object is dependent on the flaw size, with deeper flaws causing larger strength reductions. In all cases, the introduction of sharp flaws in glass substrate results in a significant loss of strength. Present approaches for addressing that problem therefore rely on surface removal, typically by grinding and polishing or chemical etching, to simply remove the flawed surfaces from the glass substrate.

Without wishing to be limited by theory, it is suspected the methods provided in the present disclosure relate to flaw modification rather than complete removal of flaws. In accordance with such modifications the crack propagation characteristics of the surface flaws are then shifted from behaviors governed by fracture mechanics to those more governed by stress concentration behavior.

Figure 7:
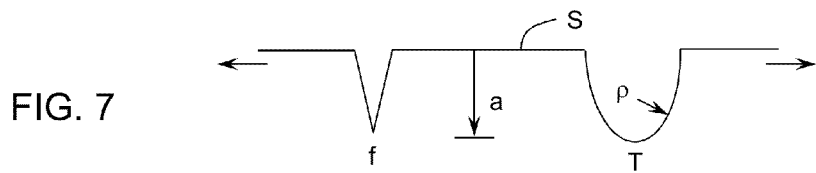
FIG. 7 illustrates factors affecting the failure strengths of flawed glasses.

A comparison of such differing crack propagation behaviors is schematically presented in FIG. 7. As shown in FIG. 7, for a glass substrate with a surface S under an applied tensional stress indicated by opposing arrows in the drawing, the magnitude of the resulting stress $\sigma_f$ at sharp crack tip f of depth "a" in glass surface S depends on the elastic modulus E and the surface energy $\gamma_s$ of the glass in accordance with the expression:

$$\sigma_f = \left(\frac{2E\gamma_s}{\pi\alpha}\right)^{\frac{1}{2}}$$

In contrast, the resulting stress $\sigma_A$ at a rounded or blunted crack tip T in a crack of the same depth a in the glass surface under the same globally applied tensional stress $\sigma$ is governed by the radius $\rho$ of the rounded crack tip in accordance with the expression:

$$\sigma_A = \sigma\left(1 + \sqrt{\frac{a}{\rho}}\right)$$

Thus, the resulting stress at blunted crack tip T is reduced in proportion to the degree of crack tip rounding, ultimately approaching the far-field or globally applied stress $\sigma$ as the tip radius $\rho$ becomes very large.

The strengthening effects of surface flaw modification in unstrengthened glass panel substrates for information display applications using treatment with an aqueous acid solution are both critical and unexpected. In particular embodiments, these unstrengthened substrates are composed of alkaline earth boro-aluminosilicate glasses wherein the total concentration of alkali metal oxides selected from the group consisting of $Na_2O$, $K_2O$ and $Li_2O$ is low or limited to impurity levels. Typically, the concentration of alkali metal oxides in the glass sheet does not exceed 5% by weight, or in particular embodiments does not exceed 1% or even 0.1% by weight. In contrast to the case of chemically strengthened cover glass substrate plates for video displays, wherein very high surface stresses (on the order of 500 MPa or more) are present in the chemically strengthened substrate to help combat the effects of surface flawing, alkaline earth boro-aluminosilicate glasses treated in accordance with the present disclosure are neither chemically strengthened nor chemically strengthenable. Thus, these display substrates are substantially free of surface compression layers and central tensional stresses. In addition, the substrates are in many cases very thin, with typical embodiments comprising substrates having thicknesses not exceeding 500 μm, or in the case of flexible substrates, thicknesses of less than 300 μm, such as in the range of 50-200 μm.

The failure strengths of unstrengthened, typically flawed glass panels of the above described low-alkali glasses can be quite low. Down-drawn alkaline earth boro-aluminosilicate glass sheets of 0.5 mm thickness subjected to conventional cutting and separation processes in the course of preparing panels for use in active matrix display fabrication can have modulus of rupture strengths as low as 100-200 MPa when subjected to standardized ring-on-ring flexural strength testing. Traditional fracture mechanics analyses of these breakage data suggest the presence of flaws with depths in the range of 15-60 μm for glass sheet of this composition and thickness failing at these strength levels.

Glass strength is most frequently expressed using a Weibull distribution representing the probability of glass failure (fracture) occurring due to a given stress. In the more common two parameter Weibull distribution, the probability of failure may be represented by the equation:

$$P_f = 1 - \exp\left[-\left(\frac{\sigma_{max}}{\sigma_0}\right)^m\right] \tag{1}$$

where $P_f$ is the probability of failure, $\sigma_{max}$ is the maximum tensile stress in a test specimen at failure, $\sigma_0$ is the Weibull characteristic strength corresponding to a $P_f$=63% and m is the Weibull modulus. The two parameters m and $\sigma_0$ are determined experimentally by stressing a sample of the material until fracture (failure) occurs. The stress value $\sigma_0$ is the experimentally determined stress such that fracture occurs with the probability noted above. The Weibull modulus provides a measure of the statistical spread of the distribution around $\sigma_0$. The stress at failure for a plurality of samples is measured and the probability of failure (and the Weibull parameters $\sigma_0$ and m) can be determined.

Figures 8A, 8B:
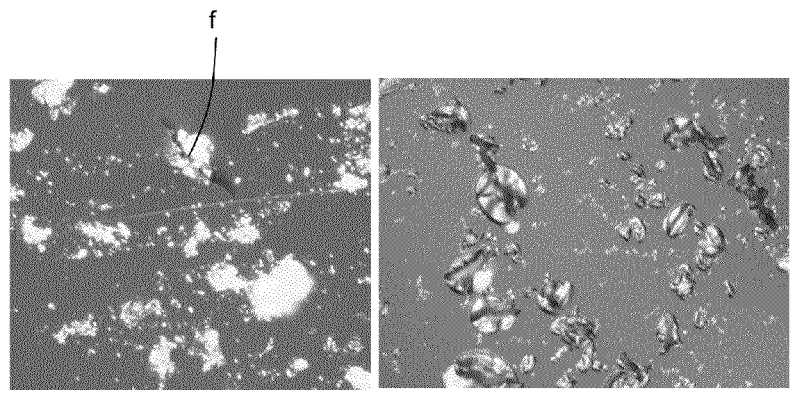
FIG. 8A is a photomicrograph of a flawed surface of a glass substrate.
FIG. 8B is a photomicrograph of a treated flawed surface of a glass substrate.

The amount of treatment with an aqueous acid solution needed to secure crack tip modifications that can provide effective glass substrate strengthening in accordance with the present disclosure is unexpectedly low, and can be completed within short time periods under relatively mild etching conditions. As an illustrative example, treatment with an aqueous acid solution sufficient to remove approximately 2.5 μm of surface glass from a commercially available alkaline earth boro-aluminosilicate glass panel can be achieved within a one minute exposure of the glass, to a dilute aqueous fluoride solution, such as a solution comprising HF and HCL in 3M and 6M concentrations, respectively. For purposes of the present description a dilute aqueous fluoride solution is a solution containing less than about 10% HF, or its equivalent, by weight. Flaws of a size and configuration effective to produce glass panels with failure strengths in the 100-200 MPa range can be artificially introduced into the unstrengthened (non-compressed) surfaces of low-alkali glasses such as the boro-aluminosilicates by abrading at least one surface of the panel with a silicon carbide abrasive. FIG. 8A is a photomicrograph of the surface of such a panel, wherein surface flaws of a diameter or depth in the 15-60 μm range were identified. An example of a flaw comprising a sharp crack tip is identified by the label "f" in the micrograph.

FIG. 8B is a photomicrograph of the surface of an identically abraded glass panel after a short etching treatment to achieve flaw crack tip modification. The treatment with the aqueous acid solution employed was a one-minute exposure of the abraded surface of the panel to the HF-HCL etching solution described above, that treatment being effective to remove about 2.5 μm of surface glass from the panel. The significant improvement in surface by the reduction in apparent surface abrasion is clearly visible, even for so short an exposure time as 1 minute. Nevertheless, there is no requirement to remove or substantially reduce the numbers or sizes of the surface flaws in order to achieve effective crack tip shape modifications in accordance with the present disclosure.

Figure 9:
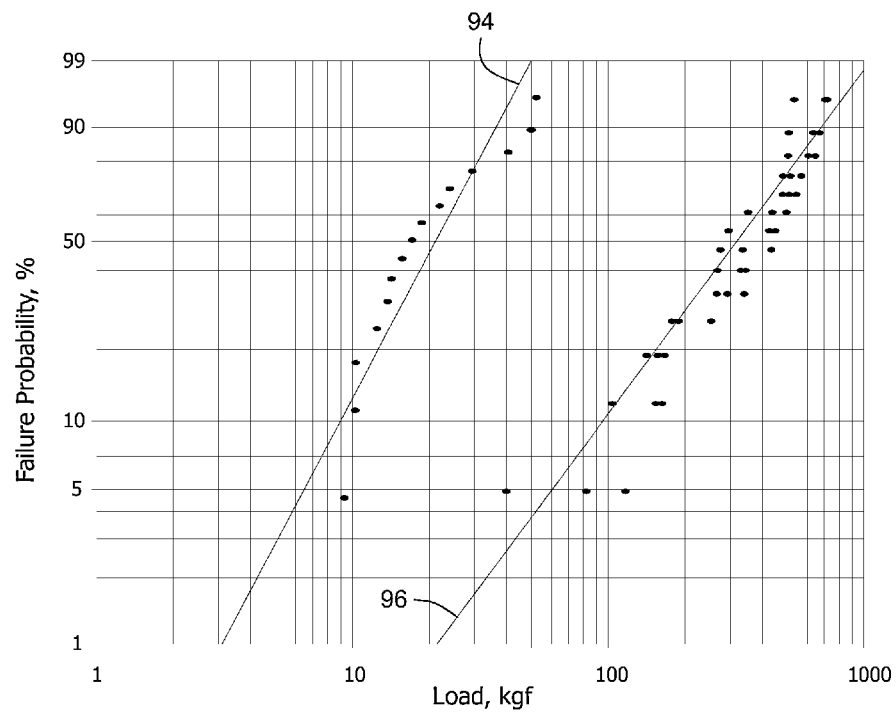
FIG. 9 presents surface-based failure probability data for untreated and treated flawed glass substrates.

The strengthening effects of the above disclosed flaw modification through treatment with an aqueous acid solution are evident from the data presented in FIG. 9 of the drawings. FIG. 9 presents Weibull plots of sample glass panel failure probabilities over a range of applied ring-on-ring flexural forces applied to sample glass substrates for two different groups of cut display-type glass substrate samples. The first group of glass substrates comprises alkaline earth boro-aluminosilicate glass substrate samples of 0.5 mm thickness prepared via the cutting and separation of continuously down-drawn glass ribbon in the manner presently employed commercially to make panel assemblies for use in active matrix display fabrication. Those samples thus comprise surface flaws typically introduced during such processing. The second group of glass substrates comprises similarly cut and separated glass substrate samples of the same size, shape and thickness, but which have been subjected to treatment with the above-described HF-HCL solution for treatment times of 1, 3 and 5 minutes.

Analyses of the data presented in FIG. 9 indicate failure stresses falling in the range of about 100 to 200 MPa for the untreated panel samples. Curve 94 is a linear fit to the failure probability data of the first group. In contrast, average failure stresses in the range of about 400-480 MPa are calculated for the glass substrate samples treated with the aqueous acid solution. Curve 96 is a linear fit to the failure probability data of the second group. The fact that the presently disclosed methods of treating with an aqueous acid solution succeed through an effective modification of the crack tip propagation characteristics of flawed glass substrate, rather than by significantly reducing the diameters, depths or numbers of such flaws, is shown by the fact that the levels of strengthening achieved in accordance with the above-described surface treatments are nearly independent of the amount of surface glass removed from the flawed surfaces. Thus, the five-minute etching treatment applied to the flawed glass substrates characterized in FIG. 9, which removes as much as 14 μm of surface glass from the treated panels, results in a level of substrate strengthening that is only slightly higher than the one-minute aqueous acid solution treatment used to remove only 2.5 μm of surface glass. Thus, in particular embodiments, treatment methods wherein the step of contacting the surface of a glass sheet or panel with a selected aqueous acid solution is carried out for a time not exceeding a time effective to remove a 5 μm-thick surface layer of glass from the panel can be sufficient to realize the necessary improvements in flaw crack tip propagation behavior.

The strengthening effects of flaw modification treatments according to embodiments of the present disclosure are also evident from the data presented in FIG. 10 of the drawings. FIG. 10 depicts Weibull plots of failure probabilities over a range of applied flexural forces applied to sample glass substrate assemblies for two different groups of glass substrate assembly samples (e.g. glass substrate assemblies 10) cut from a master glass substrate assembly (e.g. glass substrate assembly 10a). The first group of glass substrate assemblies 10 were separated from a master glass substrate assembly 10a comprising two alkaline earth boro-aluminosilicate glass substrate samples of 0.5 mm thickness joined with a UV-curable epoxy adhesive and containing a liquid crystal material sealed between the two glass substrates. The overall thickness of the master glass substrate assembly was approximately 1.05 mm. The master glass substrate assembly was then chemically thinned to an overall thickness of about 0.63 mm and cut into individual glass substrate assemblies 10 by conventional mechanical scoring and breaking techniques. The second group of glass substrate assemblies were similarly thinned, cut and separated glass substrate assemblies 10 of the same size, shape and thickness as the control group, but the edges were sealed with the UV-curable epoxy to prevent liquid ingress and the individual display panels treated by contacting the individual display panels with an HF-HCL solution of 2.0M HF and 4.5M HCl at about 30° C. for a treatment time of 3 minutes, followed by two de-ionized water rinses for a total of 20 minutes. Depth of material removal was approximately 5 μm from each glass substrate surface. The sample size for both the control and the samples treated with the aqueous acid solution was 180. Each glass substrate assembly had a diagonal measurement of 24.6 cm.

Figure 11:
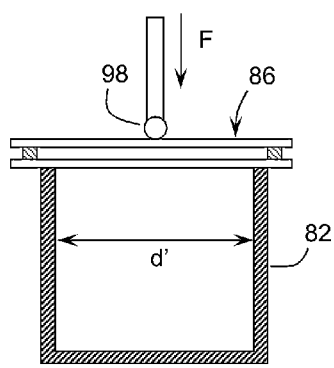
FIG. 11 is a cross sectional side view of an apparatus for performing ball-on-ring strength testing.

Fracture testing was conducted using a ball on ring testing method as illustrated by FIG. 11, wherein a sample display panel is positioned on a rigid ring (e.g. container 82 as in FIG. 5) having a diameter d' of 42.5 mm. A 30 mm diameter steel ball 98 (or other hard material capable of producing a point force) centered over the ring is forced into the surface of article to be tested, e.g. glass substrate assembly 10, at a controlled speed of 10 mm/min, as indicated by force F in the figure. Curve 100 is a linear fit to the failure probability data of the first, untreated group, and curves 102a and 102b indicate the 95% confidence intervals of the fit. In comparison, curve 104 is a linear fit to the failure probability data of the second, treated group and curves 106a and 106b indicate the 95% confidence interval of the fit.

Analyses of the data presented in FIG. 10 indicate a characteristic strength $\sigma_0$ in Newtons at 63% probability for the post-thinned control samples not treated with the aqueous acid solution to be 343 N with an m value of 1.4. On the other hand, the post-thinning samples treated with the aqueous acid solution had a characteristic strength $\sigma_0$ in Newtons at a 63% probability of 887 N and an m value of 9.30, showing that treatment with an aqueous acid solution as described herein provided a significant increase in strength.

Treatment with an aqueous acid solution described in examples herein, wherein the surface of a glass sheet or panel is contacted with a selected aqueous acid solution, are carried out for a time not exceeding a time effective to remove no more than about a 20 μm-thick surface layer of glass from one or both major surfaces of the glass sheet and/or panel, for example not more than about 15 μm, not more than 10 μm, and in some examples, not more than about 5 μm, which material removal amounts are sufficient to realize the aforementioned improvements in flaw crack tip propagation behavior. According to embodiments of the present disclosure, Weibull distributes can be obtained that exhibit a characteristic strength, $\sigma_0$, at a probability of 63% that are equal to or greater than 800 N, greater than 820 N, greater than 840 N, greater than 860 N, greater than 880 N, and even greater than 900 N, with a Weibull modulus, m, greater than 8.0, greater than 8.4, greater than 8.8, and even greater than 9.2. A comparison of glass strength after treatment with an aqueous acid solution according to embodiments of the present disclosure to untreated glass strength can be seen in reference to FIG. 5, wherein bar 108 represents the failure stress of a glass substrate assembly 10 after treatment with an aqueous acid solution. As indicated, the glass substrate assembly treated with the aqueous acid solution had a failure stress of approximately 1000 MPa, nearly has high a failure stress as the individual glass substrates provided at steps 32, 42. The dramatic increase in glass strength after treatment with an aqueous acid solution according to examples of the present disclosure can be observed by noting the stark difference in the two Weibull plots shown in both FIGS. 6 and 10.

The glass substrate strengthening methods of the present disclosure are applicable to a wide range of differing glass substrate thicknesses and the glass substrate assemblies made therefrom. Included are individual flexible glass substrates with thicknesses of less than 200 μm, or less than 100 μm, or even less than 50 μm. Due to the configurations of electronic display devices for which flexible glass substrates are designed, stress levels much higher than are experienced by traditional active matrix video display substrates are expected. Particular embodiments of the presently disclosed substrates, e.g., substrates having thicknesses not exceeding 200 μm in combination with sufficient strength and flexibility to resist breakage at a bend radius of 10 cm following treatment with an aqueous acid solution in accordance with the present disclosure, are examples of products that will provide significant performance advantages for flexible substrate applications. And these advantages are in addition to the substantial processing advantages resulting from the relatively mild treatment conditions and minimal treatment times useful for effective glass substrate strengthening in accordance with the present description.

Wide variations in processing conditions and aqueous acid solutions can be resorted to for the practice of the disclosed methods while still securing the benefits of such methods. HF and ammonium fluoride solutions, with or without additions of mineral acids such as HCl, $HNO_3$ and $H_2SO_4$, are examples of suitable media. Other example aqueous acidic etching solutions may comprise a solution of HF and HCl such that a molar concentration of the HF is in a range from about 0.1M to about 6M and a molar concentration of the HCl is in a range from about 0.1M to about 7.0M. In other examples the aqueous acidic solution may comprise HF and HCl wherein a molar concentration of the HF is in a range from about 0.1M to about 3.0M and a molar concentration of the HCl is in a range from about 0.1M to about 6.0M. In still other examples the aqueous acidic solution comprises HF and HCl wherein a molar concentration of the HF is in a range from about 1.5M to about 2.5M and a molar concentration of the HCl is in a range from about 4.0M to about 5.0M. In yet other examples the aqueous acidic solution comprises HF and $H_2SO_4$, or HF and $HNO_3$ or a combination thereof wherein the molar concentration of $H_2SO_4$ and/or $HNO_3$ is equal to any of the ranges for HCl above. Typically, the substrate glass is contacted by the aqueous acid solution for a time not exceeding 10 minutes. However, particular fluoride concentrations of the solution will be selected depending primarily upon the treatment times and temperatures desired within which to achieve effective flaw crack tip rounding, these in any case being readily determinable through routine experiment.

Accordingly, suitable contacting times in accordance with embodiments of the present disclosure may fall within a range from about 10 seconds to about 10 minutes, in some examples in a range from about 10 seconds to about 5 minutes, in some examples in a range from about 10 seconds to about 4 minutes and in other examples in a range from about 10 seconds to about 3 minutes. In other examples suitable contacting times may fall within a range from about 10 seconds to about 2 minutes and in still other examples suitable contacting times may be equal to or less than about 1 minute.

The contacting may remove glass from each of the first and second substrates to a depth equal to or less than about 20 μm. For example, the contacting may remove glass from each of the first and second substrates to a depth equal to or less than about 15 μm and in other examples the contacting may remove glass from each of the first and second substrates to a depth equal to or less than about 10 µm. In still other examples the contacting may remove glass from each of the first and second substrates to a depth equal to or less than about 5 µm.

In some embodiments, an optional polymer film 109 may be applied to the surface of the treated glass substrates after contacting the surfaces of the glass substrates with the aqueous acid solution. A suitable polymer film is, for example, Visqueen manufactured by British Polyethylene Industries Limited. For example, the second major surfaces 20 and 26 of a glass substrate assembly 10 (or 10a) may be treated with an aqueous acid solution according to embodiments disclosed herein. The aqueous acid solution may then be rinsed from the glass substrate assembly, and a polymer film attached to one or both second surfaces 20 and/or 26. The film can remain attached to the second major surfaces until, for example, a polarizing film is to be attached to one or both of the second major surfaces.

Figure 12:
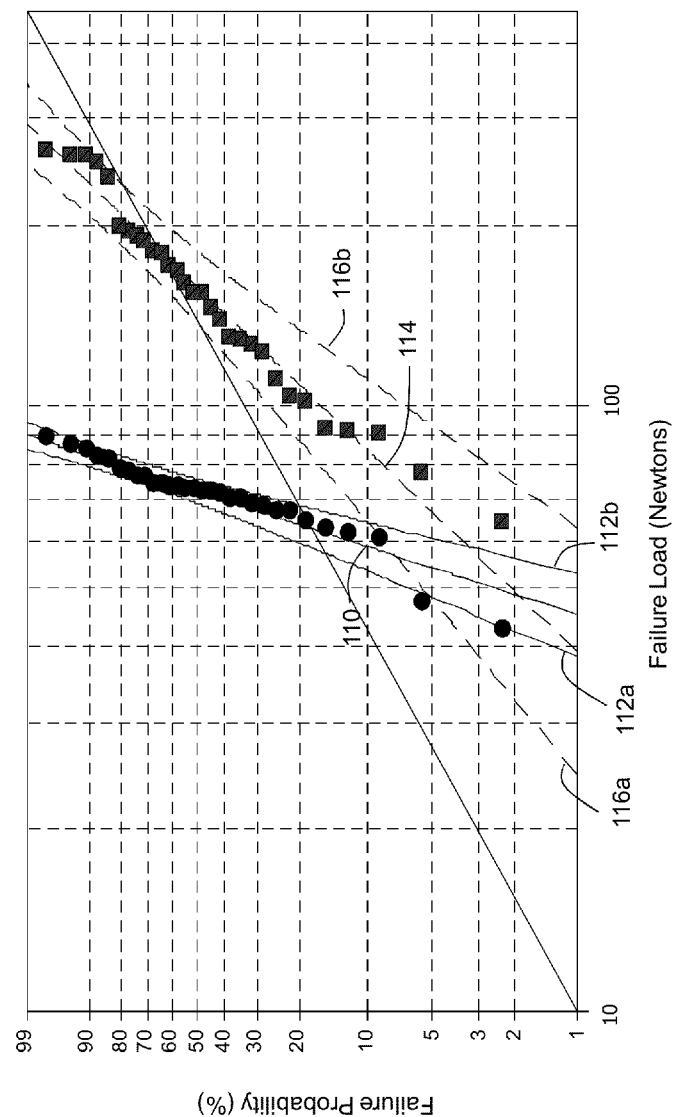
FIG. 12 presents edge-based failure probability data for treated and untreated glass substrate assemblies tested in four point bending.

Testing has found that glass sheets (e.g. glass substrate assemblies) may also benefit from increased edge strength as a result of the foregoing treatment with an aqueous acid solution. This can be useful in the instance where a master glass substrate assembly is later separated by scoring and breaking to produce smaller individual glass substrate assemblies. For example, FIG. 12 depicts a Weibull distribution based on four point bending of individual glass substrate assemblies 10 after separation of the glass substrate assemblies from a master glass substrate assembly 10a. See for example, ASTM C1683-10, Standard Practice for Size Scaling of Tensile Strengths Using Weibull Statistics for Advanced Ceramics. Curve 110 represents a linear fit to the failure probability data for a first group of glass substrate assemblies 10 that were untreated by an aqueous acid solution. Curves 112a and 112b indicate the 95% confidence intervals for the fit. On the other hand, curve 114 represents a linear fit to the data of a second group of individual glass substrate assemblies 10 after separation of the glass substrate assemblies from a master glass substrate assembly 10a, and after treatment with an aqueous acid solution according to embodiments of the present disclosure. Curves 116a and 166b depict the 95% confidence interval of the first and second fits, respectively. The data show a dramatic increase in edge strength as a result of the treatment with an aqueous acid solution. Results from strengthening the edges of sheets can also be expected as the substrate increases in length for applications as spooled ribbon in roll-to-roll processes.

The disclosed strengthening methods are not limited in their application to alkaline earth boro-aluminosilicate glass compositions alone. Other low alkali silicate glass sheets providing surfaces suitable for active semiconductor device deposition can be similarly treated with similarly satisfactory results. Also, other glass compositions not suitable for active semiconductor device deposition but optimized for other applications such as lighting, photo-voltaics and touch sensors is also possible. Further, it can be useful in some cases to apply these strengthening methods in combination with the application of surface coatings to the substrates that can offer protection for the treated surfaces of the substrates. Color filters or other polymeric protective layers are examples of such surface coatings. U.S. patent publication US2012/0040146 describes an example of edge coatings.

As noted above, there is increasing interest in the development of mechanically durable flexible glass substrates having sufficient strength and flexibility for use in roll-to-roll active matrix display, photo-voltaic, lighting and touch sensor device manufacturing processes. Although methods to etch rigid glass substrates are known, treatment of spooled flexible glass ribbons with an aqueous acid solution in accordance with the present disclosure provides increased glass strength and thus increased glass ribbon flexibility that can secure clear advantages for such use.

Flexible glass substrates for active matrix display and other applications should have a thickness of less than 300 µm, or in some embodiments not exceeding 200 µm, with thicknesses in the range of 50-100 µm being best adapted for use in roll-to-roll processing of a ribbon of thin glass. Suitable roll widths for such processing range from 1 cm to over 1 m, while ribbon lengths may range from 1 m to over 1 km. Flexible glass ribbons of these dimensions is presently manufactured via a variety of down-draw forming processes, including overflow down-drawing (fusion), slot drawing, and glass sheet redrawing. As is the case for the manufacture of conventional active matrix display panels, the glass compositions used for the manufacture of flexible glass ribbons are chosen for mechanical durability and compatibility with the selected forming process as well as the ability to provide substrates with surfaces that can stably support the semi-conductor components needed for active matrix display element fabrication. In particular embodiments the total concentration of alkali metal oxides selected from the group consisting of $Na_2O$, $K_2O$ and $Li_2O$ in the glass forming the particular ribbon or substrate does not exceed 5% by weight, or does not exceed 1% or even 0.1% by weight.

Figure 13:
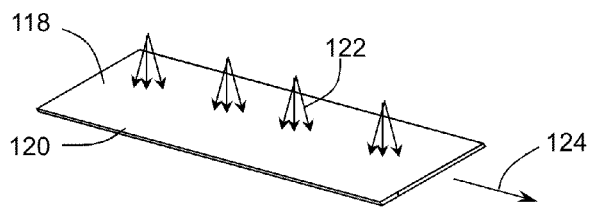
FIG. 13 schematically illustrates a first arrangement for treating a flexible glass ribbon with an aqueous acid solution.

Methods for processing spooled glass ribbons by sequentially contacting the ribbon with an aqueous acid solution include embodiments wherein the step of sequentially contacting comprises continuously transporting the glass ribbon into contact with, and then separating the glass ribbon from contact with the aqueous acid solution. In particular embodiments a roller system can be used to convey a flexible glass ribbon through a process wherein the aqueous acid solution is sprayed onto surfaces of the glass ribbon without the use of protective coatings or laminates. A suitable arrangement for processing spooled glass ribbons in accordance with these methods is schematically illustrated in FIG. 13, wherein a surface 118 of a length of flexible glass ribbon 120 is contacted with an aqueous acid solution from a plurality of spray nozzles, as represented by reference numeral 122, as the ribbon is transported in a direction indicated by arrow 124. As illustrated in FIG. 13, this enables treatment of the complete surface and edges of the flexible glass ribbon with an aqueous acid solution, with the benefit of providing a flexible glass ribbon that is free from surface and edge defects caused by glass drawing or previous handling. In these embodiments the step of contacting the lengths of the elongated glass ribbon with the aqueous acid solution is carried out for a time and at a temperature effective to blunt tip portions of cracks emanating from the surface flaws. Besides use of a spray system, the flexible glass ribbon can contact the aqueous acid solution in a bath meant to immerse the glass sequentially.

At present it is customary to set the widths for spooled glass ribbon to specific dimensions using continuous mechanical or laser cutting approaches that can generate mechanical flaws along the cut edges of the ribbon. In accordance with the present disclosure these flaws are avoided by using the aqueous acid solution to continuously separate the glass ribbon longitudinally into spooled glass ribbons of a selected width. For that purpose the elongated glass ribbon is provided with plural, spaced parallel masking layers extending lengthwise in an elongation direction over the surface of the glass ribbon, and wherein the step of sequentially contacting is carried out for a contact time and at a contact temperature effective to cause glass ribbon separation between the masking layers.

Figure 14:
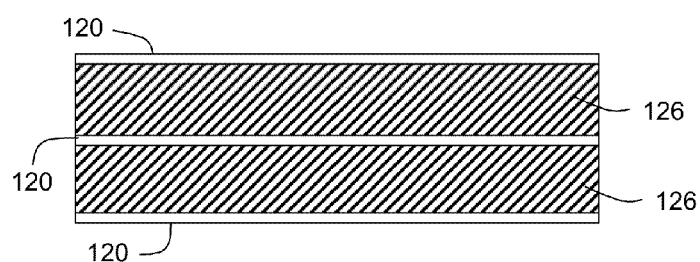
FIG. 14 schematically illustrates a second arrangement for treating a flexible glass ribbon with an aqueous acid solution.

FIG. 14 presents a schematic illustration of an arrangement for longitudinally separating a length of spooled glass ribbon into two glass ribbons. In accordance with that method two parallel bands of a mask coating 126 that is effective to prevent contact between the aqueous acid solution and the spooled glass ribbon are applied to the surface of the glass ribbon 120. With this masking in place, the aqueous acid solution applied to the exposed glass between the masking bands can effect the separation of the glass ribbon into two glass ribbons without introducing edge or surface flaws to the separated glass ribbons.

Figure 15:
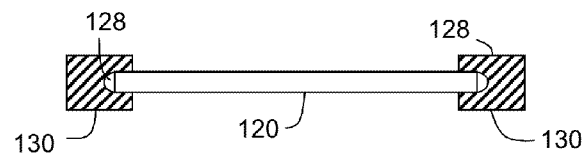
FIG. 15 presents a cross-sectional view of a glass ribbon supporting an acidic paste.

An alternative method for addressing the problem of edge flaws in spooled glass ribbon that has been separated by mechanical or laser means involves preferentially applying an aqueous acid solution to the edges of a spooled glass ribbon. In particular embodiments aqueous acid paste 128 having a paste consistency is used, and the step of sequentially contacting successive lengths of the spooled glass ribbon comprises applying the paste to cut edges of the traversing glass ribbon. This method is schematically illustrated in cross-section in FIG. 15 of the drawings, wherein the acidic paste is shown as applied to the edges of a glass ribbon 120. The acidic paste is applied along the edge face of a glass ribbon before an edge laminate is applied. In that embodiment only a minimal amount of acidic paste is used along the edge face, the objective being to merely re-shape any pre-existing flaws in the glass. The paste can be sealed to the glass with either a permanent or temporarily bonded edge laminate 130.

Figure 16:
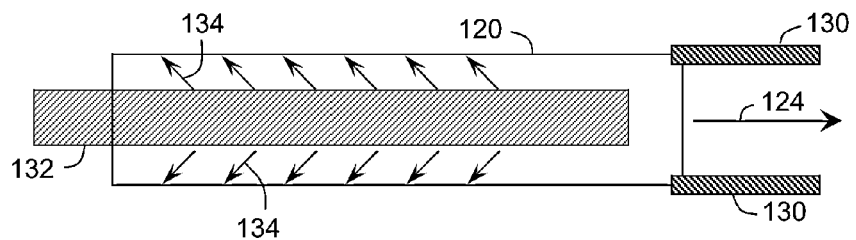
FIG. 16 schematically illustrates a third arrangement for treating a flexible glass ribbon with an aqueous acid solution.

Alternative methods for improving the edge strength of spooled glass ribbon involve selectively treating ribbon edges with an aqueous acid solution. FIG. 16 of the drawings provides a schematic illustration of this method. As shown in FIG. 16, a glass ribbon 120 to be treated is temporarily supported or attached to a carrier web 132, for example a polymer film that is temporarily attached to the glass through the use of a static charge or other method as it is transported in a glass direction through an etching station. Side jets direct a spray of aqueous acid solution according to embodiments disclosed herein toward the edges of the ribbon spaced away from the central surface of the glass ribbon, as represented by the arrows 134. Following the application of the aqueous acid solution, a de-ionized (DI) water rinse is used to remove the aqueous acid solution and forced air drying is used to remove the rinse water. An air knife or other method can be used to contain the aqueous acid solution along the glass web edge, and after contacting the glass ribbon with the aqueous acid solution the carrier web may be removed and an optional edge lamination applied to further protect the treated edge from damage.

Figure 17:
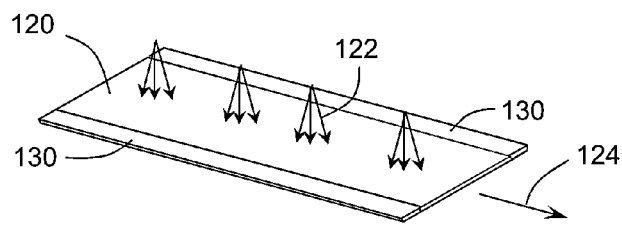
FIG. 17 schematically illustrates a fourth arrangement for treating a flexible glass ribbon with an aqueous acid solution.

In cases where a spooled glass ribbon is of high edge quality but includes sharp flaws over central sections of the glass ribbon formed during the forming or handling of the glass ribbon, a roll-to-roll spray system can be used. FIG. 17 of the drawing presents a schematic illustration of the use of such a system. As illustrated in FIG. 17, glass ribbon 120 is continuously transported in direction 124 past a spray nozzle array 122 emitting the aqueous acid solution while an edge laminate 130 is applied to the opposing high quality edges of the glass ribbon.

While foregoing examples relied upon treatment of glass substrates, or substrate assemblies formed from individual glass substrates, with an aqueous acid solution to modify flaw geometry (e.g. the blunting of crack tips without significant material removal from the surface of the glass substrate, it is recognized that process variables may be controlled so as to eliminate aggressive thinning and washing of, for example, a glass substrate assembly by repeated treatment of the glass substrate assembly with an aqueous acid solution described in the present disclosure. Accordingly, aqueous acid solutions of the present disclosure may be contained, for example, in separate containers, and wherein the glass substrate or substrate assembly is treated in each separate aqueous acid solution for a time sufficient to remove a predetermined portion of the total material to be removed. The concentration of acid or acids of each aqueous acid solution need not be the same concentration as the aqueous acid solution used in a subsequent treatment, and the treatment time for the substrate or substrate assembly in each aqueous acid solution need not be equal to another treatment time in another aqueous acid solution.

Figure 18:
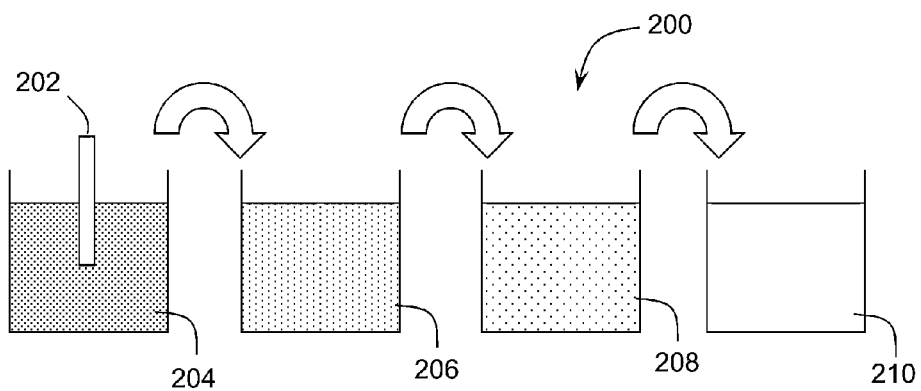
FIG. 18 is a schematic diagram illustrating a thinning process wherein the thing is performed by sequential treatments with an aqueous acid solution according to embodiment disclosed herein.

Referring to FIG. 18, a sub-process 200 for removing a predetermined amount of material as desired is shown, such as a 200 µm layer of glass, a glass article (e.g. glass substrate or substrate assembly), generically labeled as reference numeral 202, may be treated in a first aqueous acid solution 204 for a time sufficient to remove a 70 µm thick layer of glass. The glass article 202 can then be moved to a second aqueous acid solution 206 and treated for a time sufficient to remove another portion of the total material removal depth, such as an additional 70 µm. The glass article 202 may then be treated for a third time in a third aqueous acid solution 208 sufficient to removed still more material, such as the final 60 µm of the total desired 200 µm of material removal. In accordance with the description above, the concentration of acids in the first aqueous acid solution 204 need not be the same concentration of acids in either the second or third aqueous acid solutions 206, 208 respectively, and the concentrations of acids in the second aqueous acid solution 206 need not be the same concentration of acids in the first or third aqueous acid solutions, 204 and 208, respectively.

Removal of material in successive steps, in separate aqueous acid solutions, either by spraying methods as previously described, or by immersion in separate baths (e.g. separate containers of aqueous acid solution) reduces the buildup of aqueous acid solution treatment by-products (sludge), thereby extending the effective longevity of the aqueous acid solution and reducing costs.

The preceding sequential material removal steps described in reference to FIG. 18 may further include one or more rinsing steps in a rinsing solution 210. For example, the glass substrate or substrate assembly may be rinsed after the final treatment step as shown in FIG. 18, or rinsed after each treatment step, or a combination thereof. By rinsing what is meant is exposing the glass substrate or substrate assembly to a rinsing solution, such as de-ionized water, without brushing or other mechanical contact (other than contact necessary to manipulate the glass article).

Figure 19:
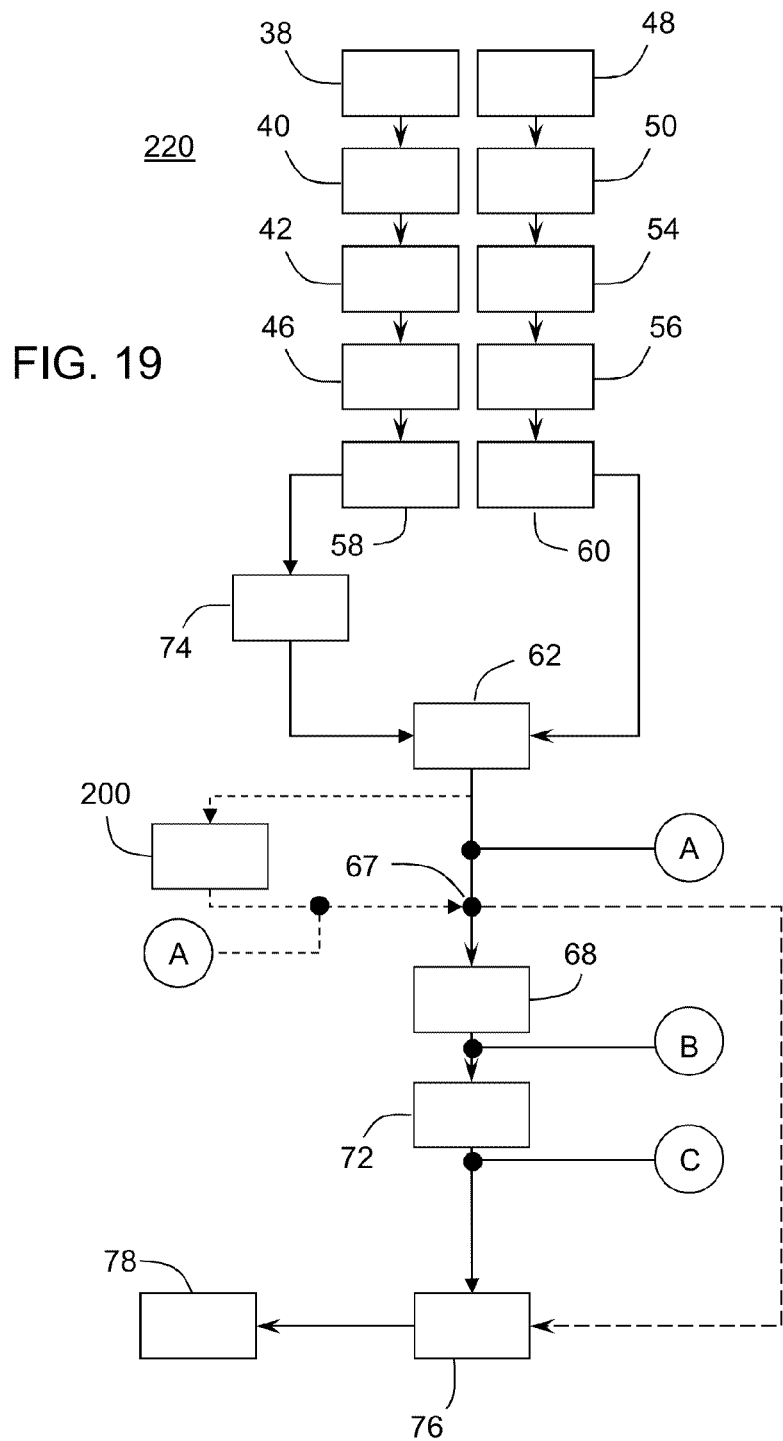
FIG. 19 is an exemplary glass substrate assembly manufacturing process utilizing the process of FIG. 18.

FIG. 19 illustrates an exemplary glass substrate assembly manufacturing process 220 based on process 37 of FIG. 3, wherein the thinning process comprising steps 64 and 66 has been replaced by process 200 described supra.

While the methods and products disclosed herein have been described above with reference to specific embodiments thereof, it will be recognized that those examples have been presented for purposes of illustration only, and that a wide variety of alternative procedures and product features may be adopted for the practice of the disclosed methods and the design of additional products within the scope of the appended claims.

What is claimed is:

1. A method for manufacturing an electronic device comprising:
   depositing thin film transistors on a first glass substrate;
   joining the first glass substrate to a second glass substrate to form a glass substrate assembly, there being a gap between the first and second glass substrates;
   contacting the glass substrate assembly with an aqueous acidic solution for a time from 10 seconds to less than or equal to 10 minutes, whereby glass from each of the first and second substrates is removed to a depth only from 2.5 µm to less than or equal to 20 µm when the time has elapsed;

rinsing the aqueous acidic solution from the glass substrate assembly when the time has elapsed;
injecting a liquid crystal material into the gap; and
wherein the contacting is performed after the step of joining but before the step of injecting.

2. The method according to claim 1, wherein the contacting is conducted for a time from 10 seconds to less than or equal to 5 minutes.

3. The method according to claim 1, wherein prior to the contacting, the glass substrate assembly is thinned by exposing the glass substrate assembly to an etchant that removes glass from at least one of the first or second glass substrates to a depth of at least about 100 μm and then washing the glass substrate assembly.

4. The method according to claim 1, further comprising applying a polymer film to the glass substrate assembly after the step of contacting.

5. The method according to claim 4, further comprising removing the polymer film and applying a polarizing material to the glass substrate assembly.

6. The method according to claim 1, wherein the glass substrate assembly is a master glass substrate assembly, the method further comprising separating the master glass substrate assembly into a plurality of individual glass substrate assemblies, and wherein the step of contacting occurs after the step of separating.

7. The method according to claim 1, wherein at least one of the first or second glass substrates comprises an alkaline earth boro-aluminosilicate glass comprising a total concentration of alkali metal oxides selected from the group consisting of $Na_2O$, $K_2O$ and $Li_2O$ that does not exceed 5% by weight.

8. The method according to claim 1, wherein the aqueous acidic solution comprises HF and HCl, and wherein a molar concentration of the HF is in a range from about 1.5M to about 4M and a molar concentration of the HCl is in a range from about 4.0M to about 7.0M.

9. The method according to claim 1, wherein the aqueous acidic solution comprises HF and $H_2SO_4$.

10. The method according to claim 1, wherein a thickness of either one or both of the first or second glass substrates is less than or equal to 500 μm before contacting the glass substrate assembly with the aqueous acidic solution.

11. The method according to claim 1, wherein either one or both of the first or second glass substrates is substantially free of surface compression layers and central tensional stresses.

12. A method for manufacturing an electronic device comprising:
depositing thin film transistors on a first glass substrate;
joining the first glass substrate to a second glass substrate to form a glass substrate assembly, there being a gap between the first and second glass substrates;
thinning the glass substrate assembly;
after thinning, contacting the glass substrate assembly with an aqueous acidic solution for a time from 10 seconds to less than or equal to 10 minutes;
rinsing the aqueous acidic solution from the glass substrate assembly when the time has elapsed;
injecting a liquid crystal material into the gap; and
wherein the contacting is performed after the step of joining but before the step of injecting.

13. The method according to claim 12, wherein the contacting is conducted for a time from 10 seconds to less than or equal to 5 minutes.

14. The method according to claim 12, wherein the contacting removes glass from each of the first and second substrates to a depth from 2.5 μm to less than or equal to 20 μm before the aqueous acidic solution is rinsed from the glass substrate assembly.

15. The method according to claim 12, wherein the thinning comprises exposing the glass substrate assembly to an etchant that removes glass from at least one of the first or second glass substrates to a depth of at least about 100 μm and then washing the glass substrate assembly.

16. The method according to claim 12, further comprising applying a polymer film to the glass substrate assembly after the step of contacting.

17. The method according to claim 16, further comprising removing the polymer film and applying a polarizing material to the glass substrate assembly.

18. The method according to claim 12, wherein the glass substrate assembly is a master glass substrate assembly, the method further comprising separating the master glass substrate assembly into a plurality of individual glass substrate assemblies, and wherein the step of contacting occurs after the step of separating.

19. The method according to claim 12, wherein at least one of the first or second glass substrates comprises an alkaline earth boro-aluminosilicate glass comprising a total concentration of alkali metal oxides selected from the group consisting of $Na_2O$, $K_2O$ and $Li_2O$ that does not exceed 5% by weight.

20. The method according to claim 12, wherein the aqueous acidic solution comprises HF and HCl, and wherein a molar concentration of the HF is in a range from about 1.5M to about 4M and a molar concentration of the HCl is in a range from about 4.0M to about 7.0M.

21. The method according to claim 12, wherein the aqueous acidic solution comprises HF and $H_2SO_4$.

22. The method according to claim 12, wherein a thickness of either one or both of the first or second glass substrates is less than or equal to 500 μm before contacting the glass substrate assembly with the aqueous acidic solution.

* * * * *